United States Patent [19]

Boone et al.

[11] Patent Number: 5,014,348

[45] Date of Patent: May 7, 1991

[54] SELF-PROGRAMMING SCANNING RADIO RECEIVER

[75] Inventors: Joseph E. Boone, Indianapolis; Ben F. McCormick, II, Noblesville, both of Ind.

[73] Assignee: Uniden America Corporation, Ft. Worth, Tex.

[21] Appl. No.: 176,657

[22] Filed: Apr. 1, 1988

[51] Int. Cl.$^5$ .............................................. H04B 1/16
[52] U.S. Cl. ................................... 455/165; 455/166; 455/161; 455/183; 455/212
[58] Field of Search ............... 455/165, 186, 264, 260, 455/161, 164, 179, 182, 183, 185, 212, 218, 221, 222, 295, 296, 264, 260, 166

[56] References Cited

U.S. PATENT DOCUMENTS

| | | | |
|---|---|---|---|
| 3,916,319 | 10/1975 | Hawley et al. | |
| 4,092,594 | 5/1978 | Baker | 455/158 |
| 4,123,715 | 10/1978 | Fathaver | 455/165 |
| 4,198,605 | 4/1980 | Yamashita et al. | 455/161 |
| 4,236,251 | 11/1980 | Ohgishi et al. | 455/165 |
| 4,264,977 | 4/1981 | Deiss | 455/182 |
| 4,367,558 | 1/1983 | Gercekci et al. | 455/164 |
| 4,368,539 | 1/1983 | Whidden | 455/166 |
| 4,461,036 | 7/1984 | Williamson et al. | 455/165 |
| 4,476,580 | 10/1984 | Tanaka et al. | 455/164 |
| 4,491,975 | 1/1985 | Ito | 455/166 |
| 4,498,191 | 2/1985 | Rogers | 455/164 |
| 4,499,601 | 2/1985 | Matthews | 455/166 |
| 4,501,020 | 2/1985 | Wakeman | 455/226 |
| 4,509,203 | 4/1985 | Yamada | 455/166 |
| 4,512,035 | 4/1985 | Victor et al. | 455/165 |
| 4,513,443 | 4/1985 | Louttit | 455/165 |
| 4,521,915 | 6/1985 | Baker et al. | 455/165 |
| 4,525,866 | 6/1985 | Templin | 455/186 |
| 4,525,867 | 6/1985 | Shiratani | 455/166 |
| 4,549,311 | 10/1985 | McLaughlin | 455/166 |
| 4,561,112 | 12/1985 | Ridder | 455/166 |
| 4,627,091 | 12/1986 | Fedele | 381/46 |
| 4,641,367 | 2/1987 | Van Deursen et al. | 455/161 |
| 4,712,241 | 12/1987 | Ecklund | 455/166 X |

FOREIGN PATENT DOCUMENTS 098634 1/1984 European Pat. Off.

OTHER PUBLICATIONS

Patent Abstracts of Japan, vol. 009197, Aug. 14, 1985, and JP-A-60062221 (Hitachi Maikuro Computer Engineer.), Apr. 10, 1985.

Primary Examiner—Benedict V. Safourek
Assistant Examiner—Ralph Smith
Attorney, Agent, or Firm—Woodard, Emhardt, Naughton, Moriarty & McNett

[57] ABSTRACT

Self-programming scanning receiver having superheterodyne circuitry, microprocessor controlled synthesized frequency tuning circuitry, frequency validation means, a learn mode to invoke the frequency validation means for all frequencies tunable by the tuning circuitry, listen mode for scanning of frequencies learned in the learn mode, and an ignore mode for erasing frequencies from permanent memory. The frequency validation means comprises a detector output connected to a high pass filter input, high pass filter output connected to a noise detector, noise detector output connected to a first A/D converter input, algorithms stored in microprocessor program memory for analyzing A/D samples obtained via first A/D for squelch condition, detector output also supplying the input of a low pass filter, output of low pass filter connected to a second A/D converter input, algorithms for analysis of A/D samples obtained from second A/D to determine sufficiency of modulation level and lack of digital waveforms, electrically alterable permanent memory for storing information identifying voice channels.

24 Claims, 4 Drawing Sheets 5,014,348

SELF-PROGRAMMING SCANNING RADIO RECEIVER

BACKGROUND OF THE INVENTION

This invention relates to scanning radio receivers, and more particularly to programmable scanning radio receivers.

Early scanning receivers used crystals for tuning, and the number of channels available for reception was limited to the number of crystals in a given receiver. A receiver typically contained either eight or sixteen crystals, and different crystals had to be installed to enable reception of different frequencies, including the frequencies of other desired transmissions within range of the receiver as well as, in the case of relocation or portable operation, the assigned frequencies in a different geographical region.

The versatility of scanning receivers was greatly enhanced with the advent of frequency synthesizers for generation of local oscillator frequencies. The frequency synthesizer is controlled by frequency codes stored in memory, and typically the memory can be reprogrammed for operation on different frequencies. It is also known to store a large number of frequency codes in memory, or alternatively to generate consecutive frequency codes as a function of known channel spacings. Increasing the number of tunable frequencies reduces the need for reprogramming, but it can also cause delays in tuning and increase the susceptibility to spurious signals commonly referred to as "birdies".

Delays in tuning occur because finite time is required for a frequency synthesizer to lock onto each new frequency and for a squelch circuit to detect presence or absence of activity on the tuned frequency. If there are many tunable frequencies and the receiver stops on each one, the time delay between successive stops on a given channel of interest can become excessive even if no other channel is active.

Birdies are internally generated signals which conventional scanning receivers recognize as active frequencies. This false recognition causes conventional scanners to stop scanning and remain tuned to that frequency, even though no audio modulation is present. When a scanner tunes to a momentarily inactive or locally unused frequency, a time delay is introduced, as mentioned above, but scanning resumes afterward. In the case of birdies, however, the scanner locks up and external intervention is required to release the scanner for further scanning.

SUMMARY OF THE INVENTION

The present invention overcomes these and other disadvantages of the prior art by providing a self-programming scanning radio receiver including means operative during a first mode of operation for automatically tuning the receiver to a plurality of radio frequencies, means for producing a receiver signal in response to each radio frequency to which the receiver is tuned, voice detection means for analyzing each receiver signal and identifying therefrom the radio frequencies carrying voice information, and scan means operative during a second mode of operation for automatically sequentially tuning the receiver to the radio frequencies identified by the voice detection means as carrying voice information.

It is a general object of the present invention to provide an improved programmable scanning radio receiver.

It is a further object of the present invention to provide a self-programming scanning receiver capable of ascertaining which radio frequencies carry voice information and storing for later scanning recall each validated frequency.

These and other objects and advantages of the present invention will become more apparent upon reading the following detailed description of the preferred embodiment in conjunction with the accompanying drawings.

DESCRIPTION OF THE PREFERRED EMBODIMENT

Figure 1:
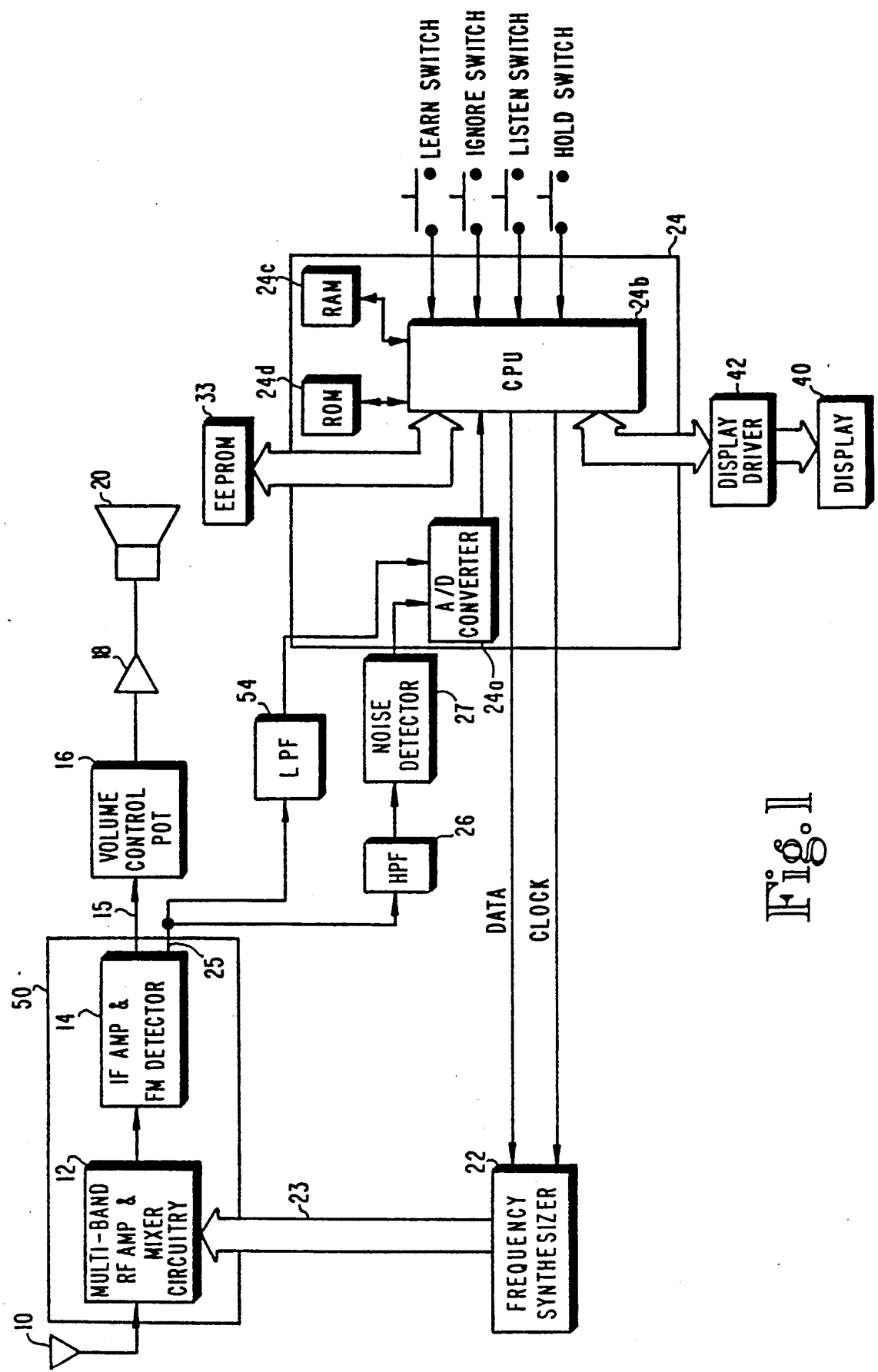
FIG. 1 is a block diagram of the preferred embodiment of the scanning radio receiver according to the present invention.

For the purposes of promoting an understanding of the principles of the invention reference will now be made to the embodiment illustrated in the drawings and specific language will be used to describe the same. It will nevertheless be understood that no limitation of the scope of the invention is thereby intended such alterations and further modifications in !he illustrated device, and such further applications of the principles of the invention as illustrated therein being contemplated as would normally occur to one skilled in the art to which the invention relates.

With reference to FIG. 1, the preferred embodiment of a scanning radio receiver 50 according to the present invention includes an antenna 10 coupled to a conventional superheterodyne FM receiver which includes RF amplifier and mixer circuitry 12, an IF amplifier and FM detector 14, a volume control potentiometer (pot) 16, mode control switches, an audio amplifier 18 and a speaker 20. The RF amplifier and mixer circuitry 12 includes individual RF amplifiers and mixers for the low and high VHF bands as well as the UHF band, as well as appropriate tracking circuits. The local oscillator signal for the receiver is generated by frequency synthesizer 22, which also supplies tracking signals to the three RF amplifiers and performs band switching as required. Multi-band RF amplifier and mixer circuitry such as that just described is well known in the art and does not require detailed description.

High-pass filter 26 is the first stage of a squelch circuit which also includes a noise detector 27 whose output is connected to the input of an A/D converter 24a of microprocessor 24. Also, internal to microprocessor 24 is central processing unit (CPU) 24b, random-access memory (RAM) 24c, and read-only memory (ROM) 24d. Microprocessor 24 analyzes the signal from noise detector 27 to determine whether a carrier has been received by antenna 10. If only high frequency audio signals are detected by the squelch circuit, carrier is presumed absent, and the microprocessor 24 will mute the audio and resume frequency scanning A number of forms of squelch circuits would be appropriate for use in conjunction with the present invention, and several suitable forms are disclosed in U.S. Patent Application Ser. No. 21,008 filed Mar. 2, 1987, which application is hereby incorporated by reference.

The scanning receiver depicted in FIG. 1 has the following functional operating modes: LEARN mode. LISTEN mode, HOLD mode, and IGNORE mode. Each mode is activated by the closure of a switch connected to the microprocessor as shown in FIG. 1. In LEARN mode the receiver programs an internal memory with or learns the frequency information used during scanning, i.e., LISTEN mode.

When microprocessor 24 detects closure of the LEARN switch, it enters the LEARN mode in which synthesizer 22 is sequentially tuned to all frequencies which the receiver is capable of receiving. For each tuned frequency, microprocessor 24 evaluates the demodulated audio signal, if it is sufficient to open squelch, and determines from characteristics of that signal whether or not the current channel is a voice channel. More specifically, frequencies modulated to a predetermined extent and determined not to be carrying digital data are considered voice channels by the microprocessor and are identified accordingly in memory for later scanning recall. A predetermined bit in EEPROM 33 is set for each analyzed radio frequency determined to be carrying voice information, and only those frequencies are scanned during LISTEN mode. Another set of bits is provided in memory for designating which frequencies have already been analyzed.

Microprocessor 24 monitors the output signal from IF amplifier and FM detector 14 after that signal is filtered through first-order lowpass filter (LPF) 54, which has a corner frequency of approximately 12 kHz. High-speed A/D sampling of the filter output signal is executed by microprocessor 24, using an internal A/D converter 24a, at a rate of 13.8 kHz. As will be described, microprocessor 24 is programmed to execute a birdie check routine in which it acquires a predetermined number of samples of the filter output and determines therefrom the extent of modulation. The microprocessor determines the sum of the absolute values of the deviations of the respective samples from the average sample value and then compares that cumulative absolute value with a predetermined threshold. A data detection program is also executed if the analyzed frequency passes the birdie check, i.e., if it is determined not to be a birdie.

Figure 2:
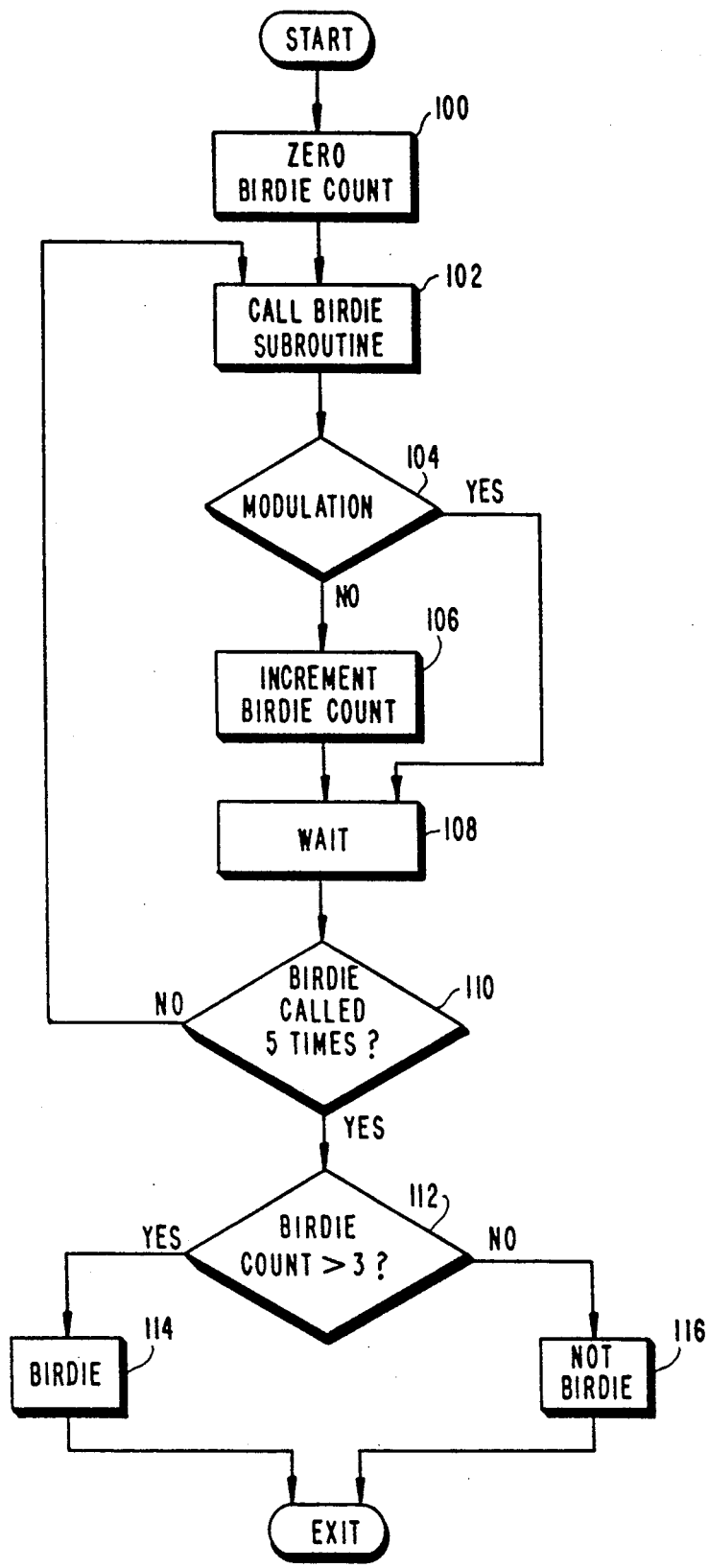
FIG. 2 is a flowchart of the "birdie" recognition program used in the receiver of FIG. 1 to detect the presence or absence of modulation on the currently tuned radio frequency.

FIG. 2 depicts the program stored in internal read-only memory (ROM) 24d of the microprocessor, executed upon actuating the LEARN switch of FIG. 1 activating microprocessor 24 of FIG. I to enter the LEARN mode and scan the entire frequency range of the receiver, testing each signal tuned for validity as to minimal modulation. A variable stored in RAM 24c of microprocessor 24 representing the program loop iteration counter of the birdie loop is zeroed in step 100 The birdie subroutine is called in step 102. Upon return from the birdie subroutine, the program tests the data returned from the birdie subroutine in step 104. If a birdie is detected by the birdie subroutine (see FIG. 3), program step 108 executes causing a delay of a predetermined amount of time before the program tests the number of calls which have occurred. If the birdie routine has been called five times the loop is completed and the program continues to step 112. If the birdie routine has not been called five times, the program returns to step 102, and the loop executes again. Once the birdie subroutine step 102 has been called five times, and five results have been obtained as determined in step 110, the program proceeds to step 112 and tests :or more than three birdie confirmations received from the birdie subroutine of FIG. 3. If four or more responses from the birdie subroutine are affirmative, then the program executes step 114 indicating a birdie has been tuned by the receiver tuning circuitry FIG. 1 and a bit is set in memory 33 by microprocessor 24 corresponding to the radio frequency tuned by the receiver. Should the birdie count be three or less the program continues with step 116, rather than 114, and no bit is set. Program flow returns to the calling program after step 114 or 116.

Figure 3:
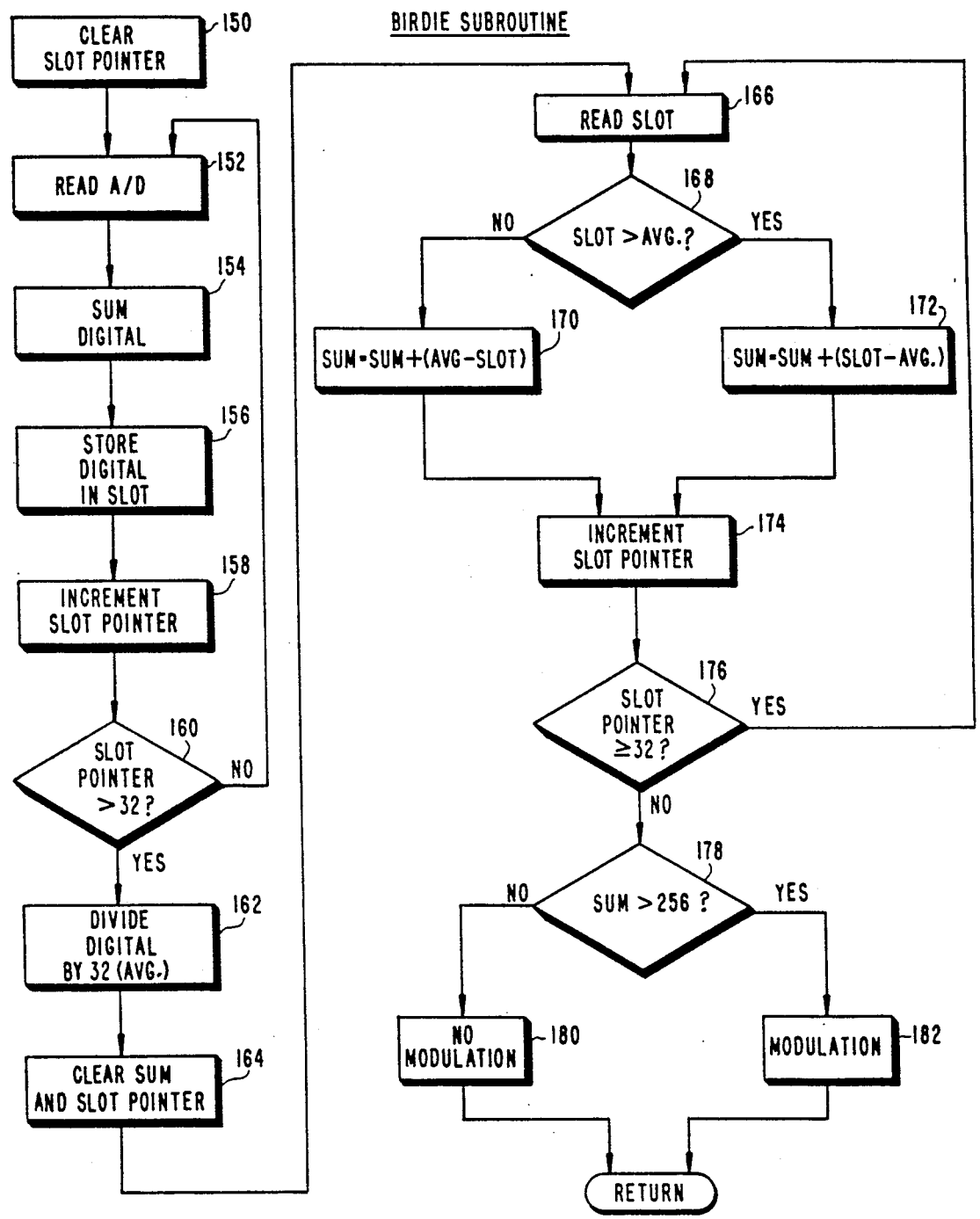
FIG. 3 is a flowchart of the subroutine called in the program of FIG. 2.

Referring to FIG. 3, the flowchart for the birdie subroutine functions as follows. The detected audio signal produced by the FM detector, after passing through lowpass filter 54, is monitored through an A/D input of microprocessor 24, FIG. 1. At step 150 a memory pointer, labeled slot pointer is cleared and thereby set to the lowest address provided in a random-access memory (RAM) 24c internal to microprocessor 24 for the A/D samples. At Step 152 the voltage from lowpass filter 54 is converted into a digital number which in step 154, is summed with the current sum of all digital numbers obtained in step 152 for the current execution of the routine. At step 156 the current digital number is stored in the memory location currently designated by the slot pointer. The slot pointer is incremented at step 158 and the loop counter for steps 152 through 160 is tested for 32 executions of the loop. If steps 152 through 160 have not yet executed 32 times, the program returns to step 152 and continues. If 32 executions of step 152 to 160 loop have occurred, step 162 executes after step 160, dividing the sum calculated in step 154 by 32, thereby averaging the A/D readings obtained in steps 150 through 160.

At step 164 the sum variable and the slot pointer are cleared. At step 166 the microprocessor reads the first location of memory set aside for A/D samples, and then, in step 168, it determines whether or not the current reading is greater than the average reading determined in step 162. If greater than the average, step 172 executes and sum is set equal to the information stored in sum plus the memory slot reading minus the average reading. If the A/D reading pointed to by slot or memory pointer is less than or equal to the average from step 162 then, at step 170 sum is set equal to sum plus the average minus the slot value. The slot pointer is incremented a: step 174, and at step 176 the program determines whether or not 32 executions of the program loop (steps 166 through 176) have occurred. If less than 32, the program returns to step 166 and the loop from step 166 through 174 is executed again by the microprocessor. If 32 or more loops from step 166 through step 174 have been completed then the conditional branch instruction in step 176 forces program execution to continue to step 178.

At step 178, microprocessor 24 tests the value stored in the memory location designated sum and determines if it is greater than 256. If so, the program continues to step 182 and sets a modulation indicator flag in RAM 24c indicating the presence of modulation. If the result in step 178 conditional block is no, then the modulation flag in RAM 24c is reset in step 180 indicating that the output of the FM detector has an insufficient AC component for genuine modulation. After the modulation flag is set or reset in steps 182 or 180, respectively, the program returns to step 104 of FIG. 2.

Figure 4:
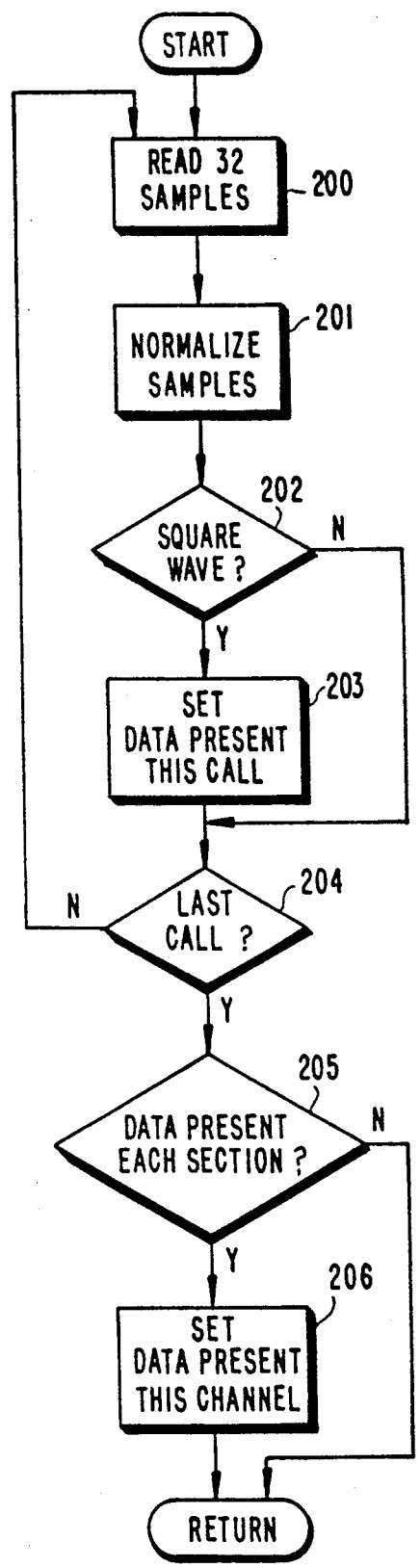
FIG. 4 is a flowchart of the program which determines whether digital data is present in the signal received by the scanning radio receiver of FIG. 1.

FIG. 4 illustrates the subroutine flowchart for the program activated by a call to the square wave detector subroutine. At step 200 microprocessor 24 takes 32 consecutive A/D readings of the filtered FM detector output signal and stores those readings in RAM 24c. At Step 201 the samples obtained in step 200 are normalized so that the lowest reading in the 32 samples is set to zero as the reference and the other 31 samples ar adjusted downward in value by the value of the smallest reading. At step 202 the program tests whether or not a square wave signal was sampled in step 200. The signal is considered to be a square wave if 24 or more of the 32 normalized samples from step 201 are either less than ¼, or greater than ¾, of the value of the largest reading of the 32. If the samples satisfy this test, the program continues at step 203 and a memory flag is set indicating that digital data has been detected in the 32 samples taken in this call to subroutine. Otherwise, data is considered not present for this call.

Steps 200 through 203 are repeated or called. 64 times, in four groups, or sections, of 16 calls. The number of calls is monitored in step 204. The results of each call and each section are stored and then analyzed in step 205 to determine whether digital data is present on the currently tuned channel. For a channel to be considered as carrying digital data, digital data must be found present in at least one of the 16 calls in three of the four sections. That is, for each section, there must be a data-present indication for at least one of the 16 calls. The use of four sections prevents falsing, and the use of 16 calls to obtain one true indication allows for noise. If these required conditions are met in step 205, program control returns to the calling routine with a memory flag set indicating that the currently tuned radio frequency is modulated with digital data. If not, program control returns with the flag not set.

LEARN mode causes microprocessor 24 to initiate a program to analyze all tunable frequencies of the receiver for squelch open condition, modulation in the detected signal and digital data. Unless squelch is open while the receiver is tuned to a particular frequency, the birdie and square wave routines will not execute with respect to that frequency. Also, if the birdie check reveals a birdie, the square wave routine will not execute; the channel is determined not to be a voice channel, and the receiver initiates tuning to the next frequency to be checked. After the receiver has tuned to all frequencies once, the receiver automatically switches to LISTEN mode and begins scanning.

LEARN mode can be subsequently activated for a second pass by again depressing the LEARN switch. This feature is useful for detecting voice channels which, due to momentary inactivity or some other reason, were previously untested. In subsequent passes, only channels which were previously identified as voice are not retested. If it is desired to delete a channel from the scan list, such is accomplished on an individual basis using the IGNORE switch. All channels can be deleted by depressing the IGNORE switch and holding it down while power is switched on to the receiver.

The HOLD switch is used to stop scanning and thereby hold the receiver tuned to the current frequency for an indefinite period. The receiver stays in HOLD mode until the HOLD switch is again closed or until the receiver is turned off.

While the invention has been illustrated and described in detail in the drawings and foregoing description, the same is to be considered as illustrative and not restrictive in character it being understood that only the preferred embodiment has been shown and described and that all changes and modifications that come within the spirit of the invention are desired to be protected.

We claim:

1. A self-programming scanning radio receiver, comprising:
   heterodyne receiver means for frequency conversion and detection of a signal modulated on an RF carrier;
   frequency synthesizer means for supplying a local tuning oscillator signal to said heterodyne receiver, said frequency synthesizer means having a frequency code input;
   frequency code generation means for supplying frequency codes to said frequency code input, said frequency code generation means including means operative during a first mode for supplying frequency codes corresponding to a predetermined set of tunable frequencies, and means operative during a second mode for supplying frequency codes in response to indicia of valid frequencies in said predetermined set of tunable frequencies;
   frequency validation means for analyzing a detected signal on a frequency corresponding to one of said frequency codes supplied to said frequency code input, said frequency validation means including means for determining valid frequencies by automatically recognizing signals representing voice information and, in response thereto, generating indicia of the valid frequencies; and
   memory means for storing said indicia of the frequencies determined to be valid by said frequency validation means, said memory means having an input coupled to said frequency validation means and an output coupled to said frequency code generation means.

2. The self-programming scanning radio receiver of claim 1 wherein said frequency validation means includes an A/D converter means for obtaining multiple A/D samples of the detected signal.

3. The self-programming scanning radio receiver of claim 2 wherein said frequency validation means includes a low pass filter means for filtering high frequencies from said detected signal and connecting the output of said low pass filter to said A/D converter means input.

4. A self-programming scanning radio receiver, comprising:
   heterodyne receiver means for frequency conversion and detection of a signal modulated on an RF carrier;
   frequency synthesizer means for supplying a local tuning oscillator signal to said heterodyne receiver, said frequency synthesizer means having a frequency code input;
   frequency code generation means for supplying frequency codes to said frequency code input, said frequency code generation means including means operative during a first mode for supplying frequency codes corresponding to a predetermined set of tunable frequencies, and means operative during a second mode for supplying frequency codes in response to indicia of valid frequencies in said predetermined set of tunable frequencies;

frequency validation means for analyzing a detected signal on a frequency corresponding to one of said frequency codes supplied to said frequency code input, said frequency validation means including means for determining valid frequencies by automatically recognizing signals representing voice information and, in response thereto, generating indicia of the valid frequencies; and A/D converter means for obtaining multiple A/D samples of the detected signal;

low pass filter means for filtering high frequencies from said detected signal and connecting the output of said low pass filter means to said A/D converter means input; and digital analysis means for computing an average for said A/D samples and summing the absolute value of the difference between each sample and the average sample value resulting in an absolute value difference sum which is compared to a predetermined value; and memory means for storing said indicia of the frequencies determined to be valid by said frequency validation means, said memory means having an input coupled to said frequency validation means and an output coupled to said frequency code generation means.

5. The self-programming scanning radio receiver of claim 4 wherein said digital analysis means obtains multiple sets of said A/D samples and multiple absolute value difference sums are computed for each set of said A/D samples by said digital analysis means and further analysis by said digital analysis means is conditioned upon a majority of said absolute value difference sums exceeding a predetermined value.

6. The self-programming scanning radio receiver of claim 5 wherein said digital analysis means obtains from said A/D convertor multiple A/D convertor samples of said low pass filter output and said digital analysis means reduces all samples by the least value sample and compares said samples to a lower and upper range limit, said range limits determined as a function of the reduced sample with the highest value, with a determination that digital data is present in the detected signal based upon a predetermined percentage of reduced samples found to be greater than said upper range limit or less than said lower range limit.

7. The self-programming scanning radio receiver of claim 6 wherein said digital analysis means obtains multiple sets of samples from said A/D converter and for each sample set said digital analysis reduces all samples by the smallest sample value of the sample set and compares each sample of the set to said lower and said upper range limits computed for each set said digital analysis summing the number of sets meeting the range check and comparing the sum to a predetermined value.

8. The self-programming scanning radio receiver of claim 7 wherein said frequency validation means stores validation results by setting a bit corresponding to the frequency in said memory means indicating an invalid frequency thereby informing said frequency code generation means not to tune to said invalid frequency while said scanning radio receiver is scanning for active radio frequencies.

9. The self-programming scanning radio receiver of claim 8 wherein said frequency code generation means includes second memory means for storing a plurality of codes corresponding to tunable frequencies said codes defining a set of frequencies which are automatically checked by said frequency validation means.

10. The self-programming scanning radio receiver of claim 9 wherein means for a second or subsequent frequency validation occurs and said frequency validation means operates only on those frequencies not previously identified as voice frequency as indicted by a bit in memory.

11. The self-programming scanning radio receiver of claim 1 wherein said frequency code generation means includes second memory means for storing a plurality of codes corresponding to tunable frequencies, said codes defining a set of frequencies which are automatically checked by said frequency validation means.

12. The self-programming scanning radio receiver of claim 1 wherein means for a second or subsequent frequency validation occurs and said frequency validation means operates only on those frequencies not previously identified as voice frequency and stored in said memory means.

13. The self-programming scanning radio receiver of claim 1 further comprising means for resetting all bits in said memory means corresponding to all frequencies determined invalid by said frequency validation means.

14. The self-programming scanning radio receiver of claim 3 wherein said low pass filter is a first-order filter with a corner frequency of approximately 13.8 kilohertz.

15. The self-programming scanning radio receiver of claim 2 wherein said A/D converter means can perform a conversion in approximately 72 microseconds, and said A/D converter means can provide 32 samples in approximately 2.3 milliseconds.

16. A self-programming scanning radio receiver comprising:
(a) a radio receiver circuit including an RF amplifier, a mixer coupled to said RF amplifier, a frequency synthesizer having a local oscillator output coupled to said mixer and further having a frequency code input, and detector means coupled to said mixer for producing a receiver signal;
(b) means operative during a first mode of operation for automatically supplying a predetermined set of frequency codes to said frequency code input for tuning said receiver to a plurality of radio frequencies;
(c) voice detection means for electronically analyzing each receiver signal for voice information and automatically storing indicia of radio frequencies carrying voice information; and
(d) scan means operative during a second mode of operation for automatically sequentially tuning said receiver discriminatively to the radio frequencies identified by said voice detection means as carrying voice information, said scan means including means responsive to said stored indicia for supplying frequency codes to said frequency code input which corresponds to the radio frequencies identified as carrying voice information.

17. The self-programming scanning radio receiver of claim 16 wherein said voice detection means includes means for recognizing birdies.

18. The self-programming scanning radio receiver of claim 17 wherein said voice detection means includes means for recognizing digital data signals.

19. The self-programming scanning radio receiver of claim 18 further comprising squelch means for inhibiting said voice detection means in the absence of a detected signal.

20. The self-programming scanning radio receiver of claim 19 wherein said voice detection means checks a frequency only once per invocation of said first mode of operation.

21. The self-programming scanning radio receiver of claim 16 wherein said voice detection means includes mean for recognizing digital data signals 22. The self-programming scanning radio receiver of claim 16 further comprising squelch means for inhibiting said voice detection means in the absence of a detected signal.

23. The self-programming canning radio receiver of claim 16 wherein said voice detection means checks a frequency only once per invocation of said first mode of operation.

24. A method of automatically programming a scanning radio receiver, comprising the steps:
 (a) automatically tuning said receiver to a plurality of radio frequencies during a first mode of operation;
 (b) generating a receiver signal in response to a radio frequency to which said receiver is tuned in said tuning step;
 (c) electronically analyzing said receiver signal for voice information;
 (d) storing identifying information in a scanning memory for radio frequencies on which voice information is detected in said analyzing step; and
 (e) automatically sequentially tuning said receiver discriminatively, during a second mode of operation, to the radio frequencies on which voice information is detected in said analyzing step.

* * * * *

UNITED STATES PATENT AND TRADEMARK OFFICE
CERTIFICATE OF CORRECTION

PATENT NO. : 5,014,348  Page 1 of 2

DATED : May 7, 1991

INVENTOR(S) : Joseph E. Boone et al.

It is certified that error appears in the above-identified patent and that said Letters Patent is hereby corrected as shown below:

In column 2, line 32, please insert a comma after "invention".

In column 2, line 36, please insert a comma after "intended".

In column 2, line 43, please delete "50".

In column 2, line 45, please insert --50-- after "receiver".

In column 3, line 2, please insert a period after "scanning".

In column 3, line 9, please change the period to a comma.

In column 3, line 14, please insert a comma after "with".

In column 3, line 14, please insert a comma after "learns".

In column 3, line 47, please insert a comma after "value".

In column 3, line 60, please insert a period after "100".

In column 4, line 4, please change "b®en ca)led" to --been called--.

In column 4, line 6, please change ":or" to --for--.

In column 4, line 11, please insert a comma after "1".

In column 4, line 22, please insert a comma after "pointer", second occurrence.

In column 4, line 26, please insert a comma after "which".

In column 4, line 50, please insert a comma after "162".

In column 4, line 50, please insert a comma after "170".

In column 4, line 52, please change "a:" to --at--.

UNITED STATES PATENT AND TRADEMARK OFFICE
CERTIFICATE OF CORRECTION

PATENT NO. : 5,014,348

DATED : May 7, 1991

INVENTOR(S) : Joseph E. Boone et al.

It is certified that error appears in the above-identified patent and that said Letters Patent is hereby corrected as shown below:

In column 5, line 23, please change the period to a comma.
    In column 6, line 4, please insert a comma after "character".
    In column 7, line 68, please insert a comma after "frequencies".
    In column 8, line 59, please change "corresponds" to --correspond--.
    In column 9, line 9, please change "mean" to --means--.
    In column 9, line 14, please change "canning" to --scanning--.

Signed and Sealed this

Eighth Day of June, 1993

Attest:

MICHAEL K. KIRK

*Attesting Officer*     *Acting Commissioner of Patents and Trademarks*